United States Patent
Liu et al.

(10) Patent No.: US 9,589,094 B2
(45) Date of Patent: Mar. 7, 2017

(54) SEMICONDUCTOR DEVICE AND LAYOUT METHOD THEREOF

(71) Applicant: TAIWAN SEMICONDUCTOR MANUFACTURING COMPANY LTD., Hsinchu (TW)

(72) Inventors: Szu-Lin Liu, Hsinchu (TW); Jaw-Juinn Horng, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 36 days.

(21) Appl. No.: 14/722,714

(22) Filed: May 27, 2015

(65) Prior Publication Data

US 2016/0292339 A1   Oct. 6, 2016

Related U.S. Application Data

(60) Provisional application No. 62/140,729, filed on Mar. 31, 2015.

(51) Int. Cl.
*G06F 17/50* (2006.01)

(52) U.S. Cl.
CPC ............... *G06F 17/5072* (2013.01)

(58) Field of Classification Search
CPC ............ G06F 17/5081; G06F 17/5068; G06F 17/5072
USPC .................. 716/100, 111, 118, 119, 124
See application file for complete search history.

(56) References Cited

U.S. PATENT DOCUMENTS

| | | | | |
|---|---|---|---|---|
| 7,892,982 B2* | 2/2011 | Lee et al. | ............ | H01L 21/0332 216/67 |
| 8,759,163 B2* | 6/2014 | Peng et al. | .......... | G06F 17/5072 257/499 |
| 8,835,321 B2* | 9/2014 | Ha | ....................... | H01L 21/0337 438/696 |
| 8,916,955 B2* | 12/2014 | Peng et al. | .......... | G06F 17/5063 257/618 |
| 8,978,000 B2* | 3/2015 | Huang et al. | ....... | G06F 17/5068 716/111 |
| 2007/0174802 A1* | 7/2007 | Shin et al. | ................. | G03F 1/36 716/124 |
| 2013/0285190 A1* | 10/2013 | Peng et al. | .......... | G06F 17/5072 257/499 |
| 2015/0108610 A1* | 4/2015 | Peng et al. | .......... | G06F 17/5063 257/618 |

* cited by examiner

*Primary Examiner* — Sun Lin
(74) *Attorney, Agent, or Firm* — WPAT, P.C., Intellectual Property Attorneys; Anthony King

(57) ABSTRACT

In some embodiments, a semiconductor device includes a cell array, a first region and a second region. The first region surrounds the cell array and has a first pattern density. The second region is between the cell array and the first region. The second region surrounds the cell array and has a second pattern density smaller than a third pattern density of the cell array, which in turn is smaller than the first pattern density.

20 Claims, 13 Drawing Sheets

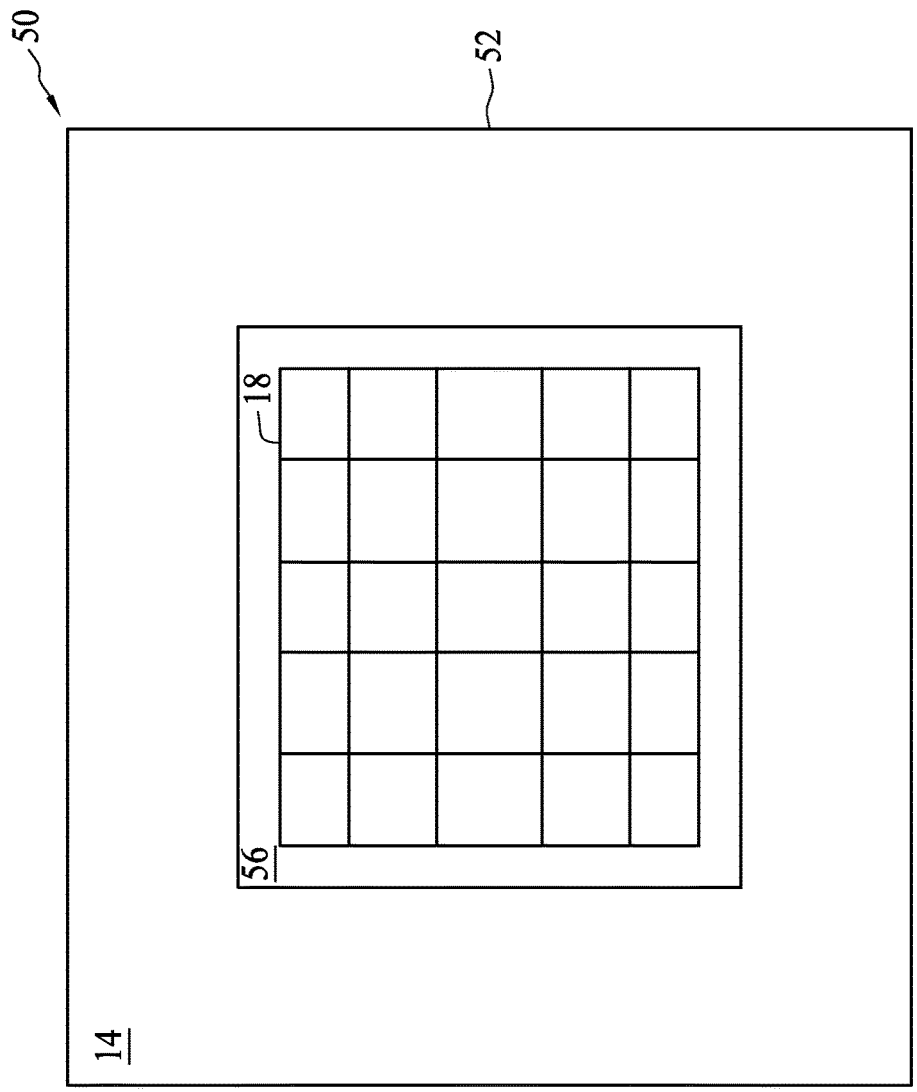

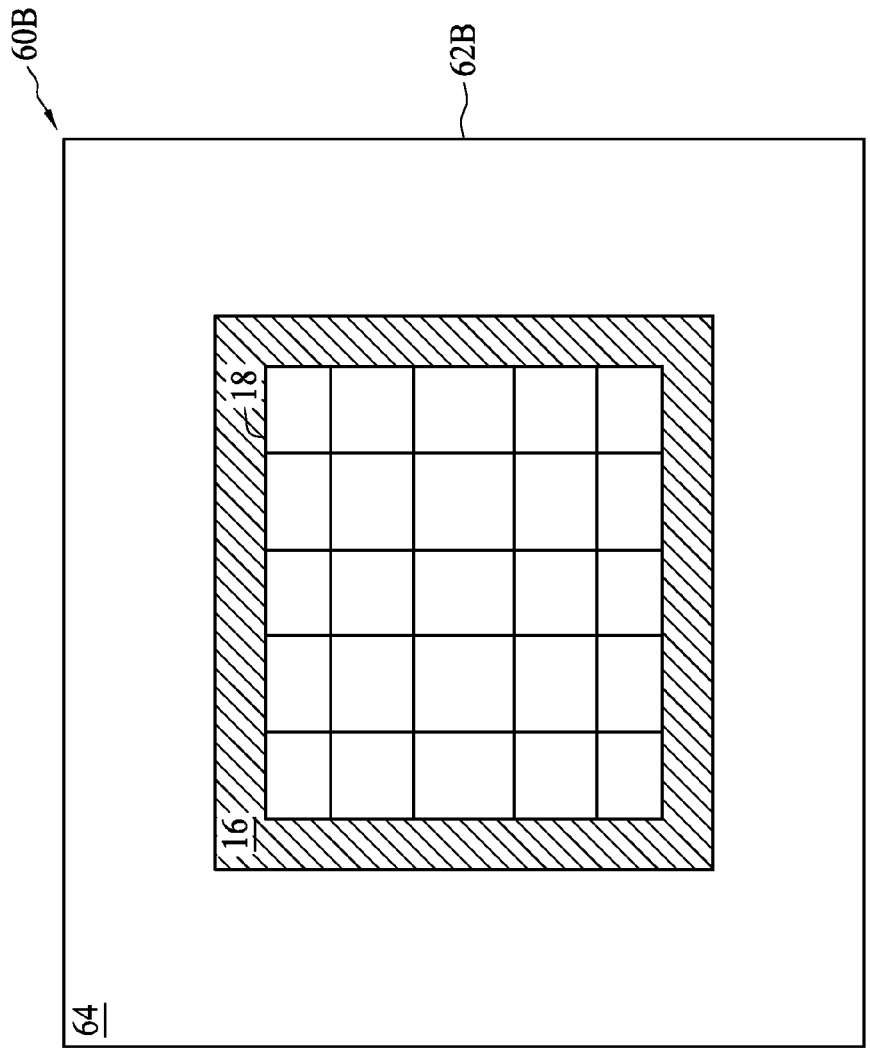

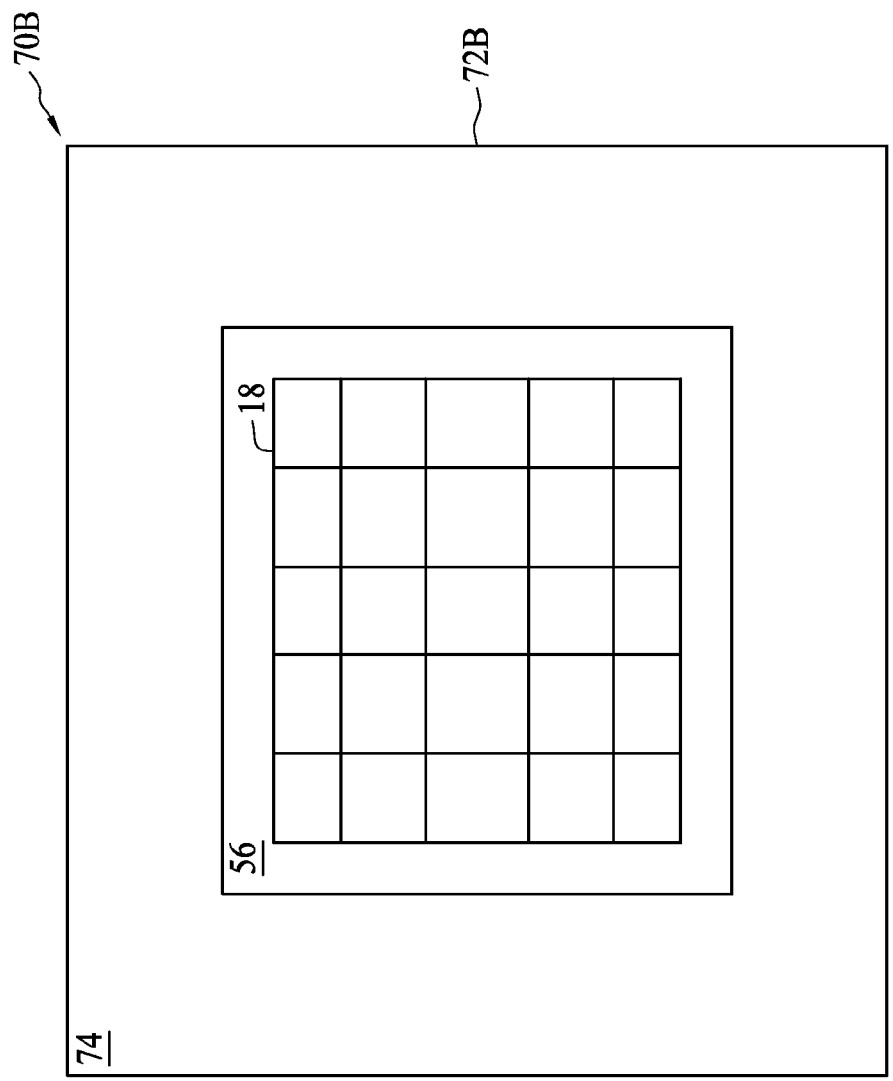

SEMICONDUCTOR DEVICE AND LAYOUT METHOD THEREOF

PRIORITY CLAIM AND CROSS-REFERENCE

This application claims the benefit of provisional application Ser. 62/140,729 filed on Mar. 31, 2015, entitled "SEMICONDUCTOR DEVICE AND LAYLOUT METHOD THEREOF," the disclosure of which is hereby incorporated by reference in its entirety.

BACKGROUND

In semiconductor manufacturing, semiconductor components of an integrated circuit are required to match each other in function or operation. With the advancement in technology leading to smaller feature sizes and more stringent design constraints, device mismatch has become an increasingly serious concern. For example, in a metal-oxide-semiconductor transistor array, transistors may be liable to edge-to-center (ETC) current mismatch due to density-gradient effect (DGE).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 is a schematic layout view of a semiconductor device, in accordance with some embodiments.

FIG. 6B is a schematic layout view of a semiconductor device, in accordance with some embodiments.

FIG. 7B is a schematic layout view of a semiconductor device, in accordance with some embodiments.

DETAILED DESCRIPTION

Figure 1:
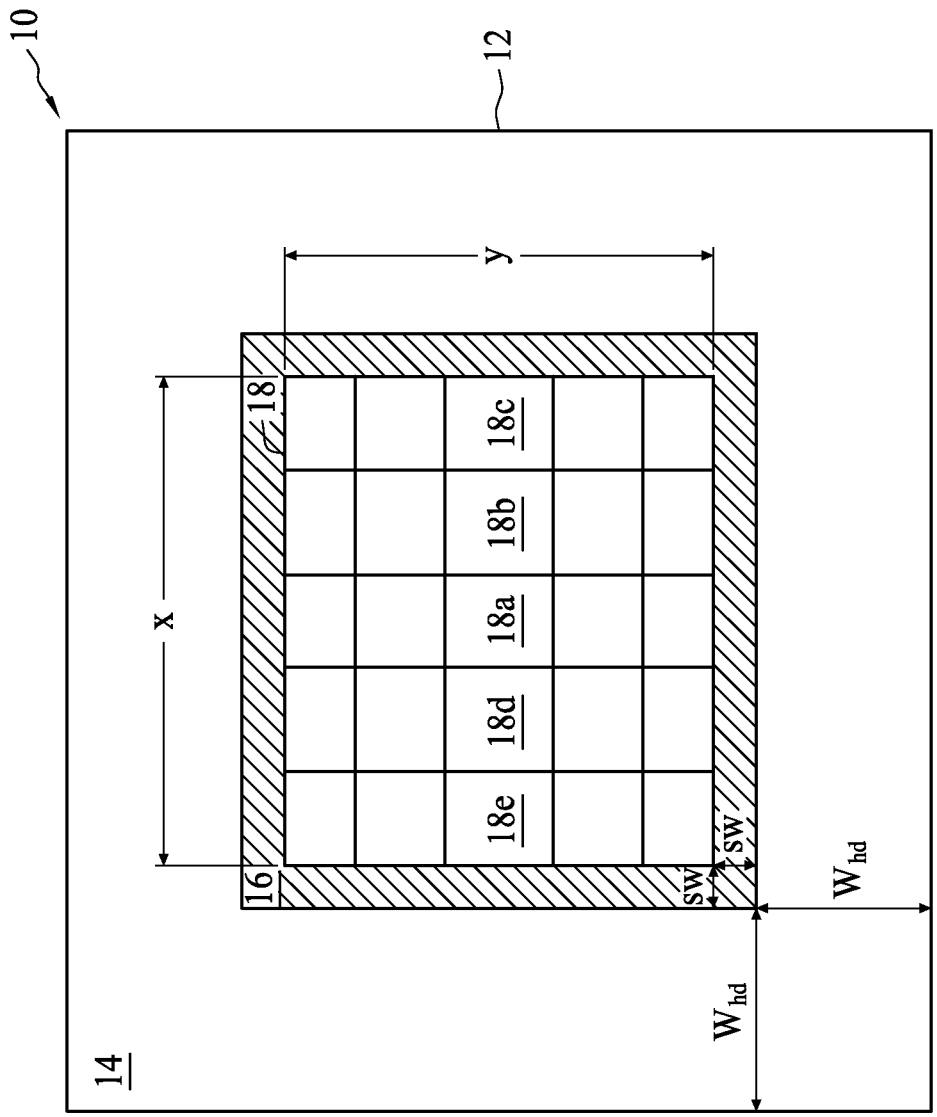
FIG. 1 is a schematic layout view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Terms used herein are only used to describe the specific embodiments, which are not used to limit the claims appended herewith. For example, unless limited otherwise, the term one or the of the single form may also represent the plural form. The terms such as "first" and "second" are used for describing various devices, areas and layers, ETC., though such terms are only used for distinguishing one device, one area or one layer from another device, another area or another layer. Therefore, the first area can also be referred to as the second area without departing from the spirit of the claimed subject matter, and the others are deduced by analogy. Moreover, space orientation terms such as "under", "on", "up", "down", ETC. are used to describe a relationship between a device or a characteristic and another device or another characteristic in the drawing. It should be noted that the space orientation term can cover different orientations of the device besides the orientation of the device illustrated in the drawing.

FIG. 1 is a schematic layout view of a semiconductor device 10, in accordance with some embodiments. The semiconductor device 10 includes a substrate 12 and a cell array 18 in the substrate 12. The substrate 12 includes a first region 14 and a second region 16.

The cell array 18 is surrounded by the second region 16, which in turn is surrounded by the first region 14. The cell array 18, having a width of x and a length of y, includes a plurality of cells arranged in rows and columns. In this embodiment, for illustration, the cell array 18 includes a 5 (cell)×5 (cell) array, and only cells 18a to 18e are shown. However, the disclosure is not limited to the specific cell arrangement. For example, the cell array 18 may have a larger size and include a 10 (cell)×10 (cell) array or a 20 (cell)×20 (cell) array. Moreover, the cell array 18 may take the form of a non-square matrix and include a 1 (cell)×25 (cell) array or 4 (cell)×10 (cell) array. Each of the cells 18a to 18e includes transistors, for example, metal-oxide-semiconductor (MOS) transistors. In that case, the cell array 18 is a MOS array.

The first region 14 has a substantially ring shape and has a first width $W_{hd}$. In some embodiments, the first width $W_{hd}$ has a range of approximately 4 micrometer (μm) to 6 μm. The first region 14 functions to alleviate the density-gradient effect (DGE) issue. For example, the first region 14 may be provided with transistors identical to those in the cell array 18.

The second region 16 also has a substantially ring shape and has a second width SW. In some embodiments, the second width SW is approximately 1 μm or smaller. Moreover, the second width SW may be proportional to the first width $W_{hd}$. In some embodiments, the second width SW is approximately 10% to 20% of the first width $W_{hd}$. The second region 16 also functions to alleviate the DGE issue.

Figure 2:
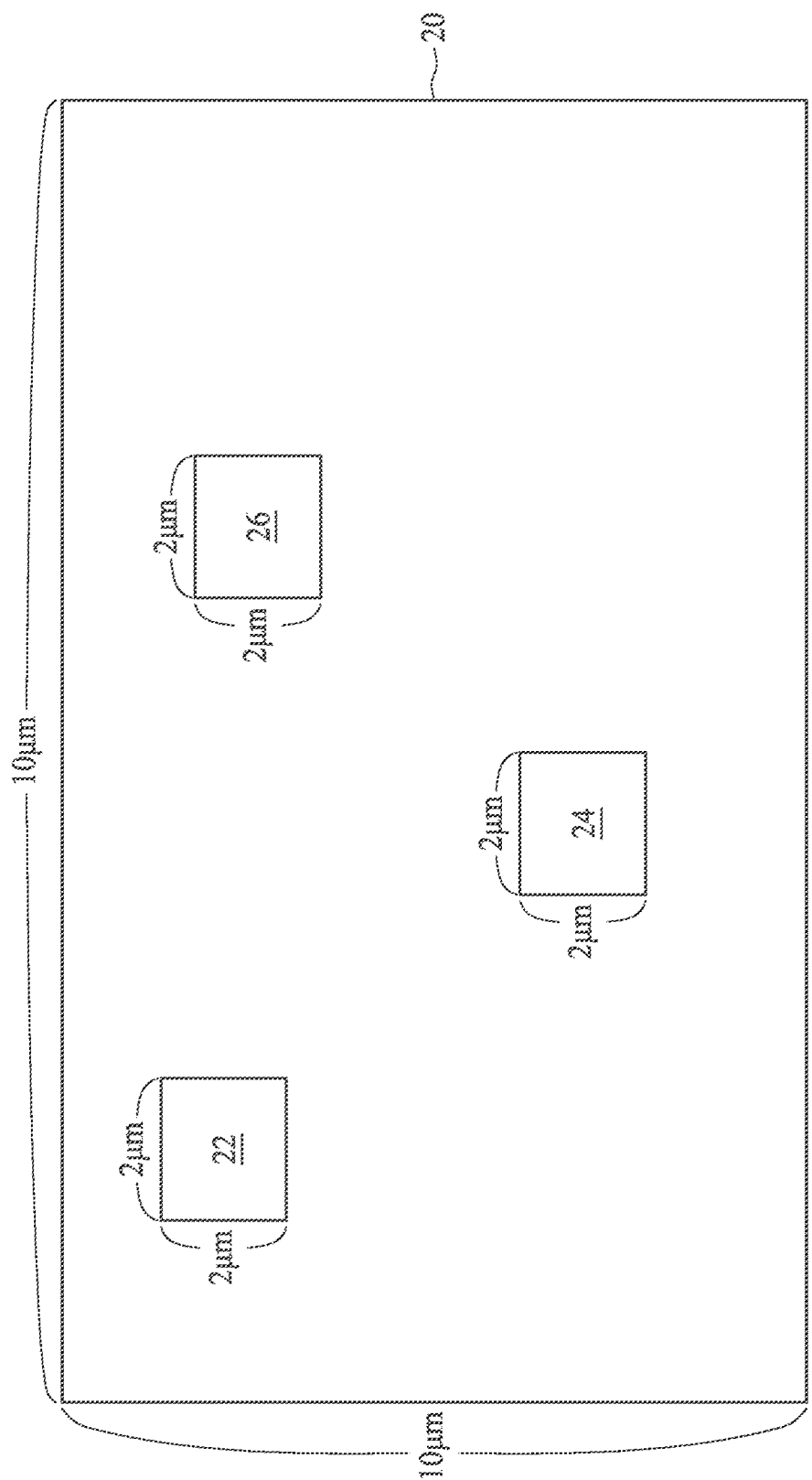
FIG. 2 is a schematic diagram illustrating the pattern density of an exemplary region.

FIG. 2 is a schematic diagram illustrating the pattern density of an exemplary region 20. Referring to FIG. 2, three shapes or polygons 22, 24 and 26 are disposed in the region 20. A shape or polygon refers to a device feature such as via, contact, poly, metal 1 or metal 2 in a layout design. In the present example, the region 20 has a size of 10 μm×10 μm, and each of the shapes 22, 24 and 26 has a size of 2 μm×2 μm. The pattern density of the region 20 is a ratio between a sum of the area of the shapes 22, 24 and 26 and the area of the region 20, which can be calculated below.

$$\text{pattern density} = \frac{(2 \times 2) + (2 \times 2) + (2 \times 2)}{10 \times 10}$$

Referring back to FIG. 1, the first region 14 has a first pattern density. The second region 16 has a second pattern density. The cell array 18 has a third pattern density. The first pattern density is greater than the third pattern density, which in turn is greater than the second pattern density. In the embodiment illustrated in FIG. 1, the second region 16 is free of shapes. As a result, the second pattern density is substantially equal to zero.

Furthermore, the pattern densities of the cells in the cell array 18 are different from each other. As a result, the DGE issue may occur in the cell array 18, resulting in current mismatch, which is described below in detail.

As previously discussed, each cell in the cell array 18 may include a plurality of transistors. When a cell is coupled to a power supply, and receives electric power from the power supply, current from the power supply flows through the plurality of transistors of the cell. Due to DGE, the current flowing in the cell array 18 is different in magnitude one cell from the other. For example, the current flowing through the center cell 18a is approximately 1 mA, the current flowing through an edge cell 18b is approximately 0.95 mA, and the current flowing through another edge cell 18c is approximately 0.8 mA. As a result, the current mismatch between the center cell 18a and the edge cell 18b is approximately 0.05 mA, and the current mismatch between the center cell 18a and the edge cell 18c is approximately 0.2 mA. It is obvious that current mismatch occurring at the edge cell 18c is relatively serious. In some embodiments, current mismatch of a cell array can be obtained by calculating a mean value of the current mismatch of each of the cells in the cell array. Moreover, current match of a plurality of cell arrays in a substrate can be obtained by calculating a mean shift of the current mismatch each of the cell arrays in the substrate.

To determine the mean shift, it is assuming that there are, for example, five cell arrays in a substrate. The current mismatch values of the five cell arrays are 20%, 15%, 10%, 0% and −5%, for example. Then, the edge-to-center (ETC) current mean shift can be calculated below:

$$\text{mean} - \text{shift} = \frac{(20) + (15) + (10) + (0) + (-5)}{5}\%$$

Moreover, the ETC current standard deviation (stdev) can be calculated below:

$$stdev = \sqrt{\frac{1}{5}[(20-8)^2 + (15-8)^2 + (10-8)^2 + (0-8)^2 + (0-(-5))^2]}$$

In some existing advanced approaches, it is possible to improve the ETC current standard deviation. However, it is still difficult to improve the ETC current mean shift.

According to the present disclosure, it is found that if the cell array 18 is surrounded by the first region 14 and the second region 16 as shown in FIG. 1, not only the ETC current standard deviation can be improved, the ETC current mean shift can be improved as well. In some embodiments, the current mismatch can be alleviated by determining an optimal value of at least one of the first width $W_{hd}$ or the second width SW. The relation between the degree of current mismatch and the first width $W_{hd}$ or the second width SW will be described in detail with reference to FIGS. 3A, 3B and FIGS. 4A, 4B below.

Figure 3A:
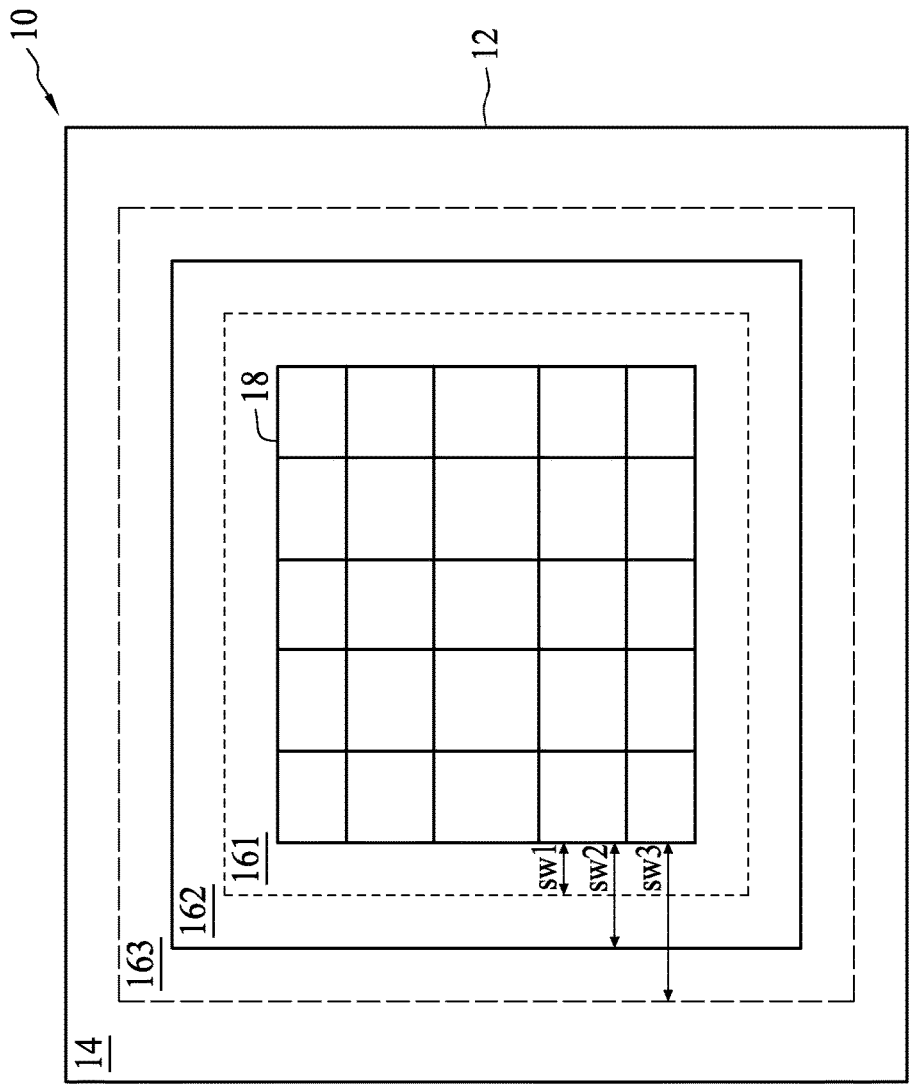
FIGS. 3A and 3B are diagrams illustrating current mismatch at different second widths, in accordance with some embodiments.
Figure 3B:
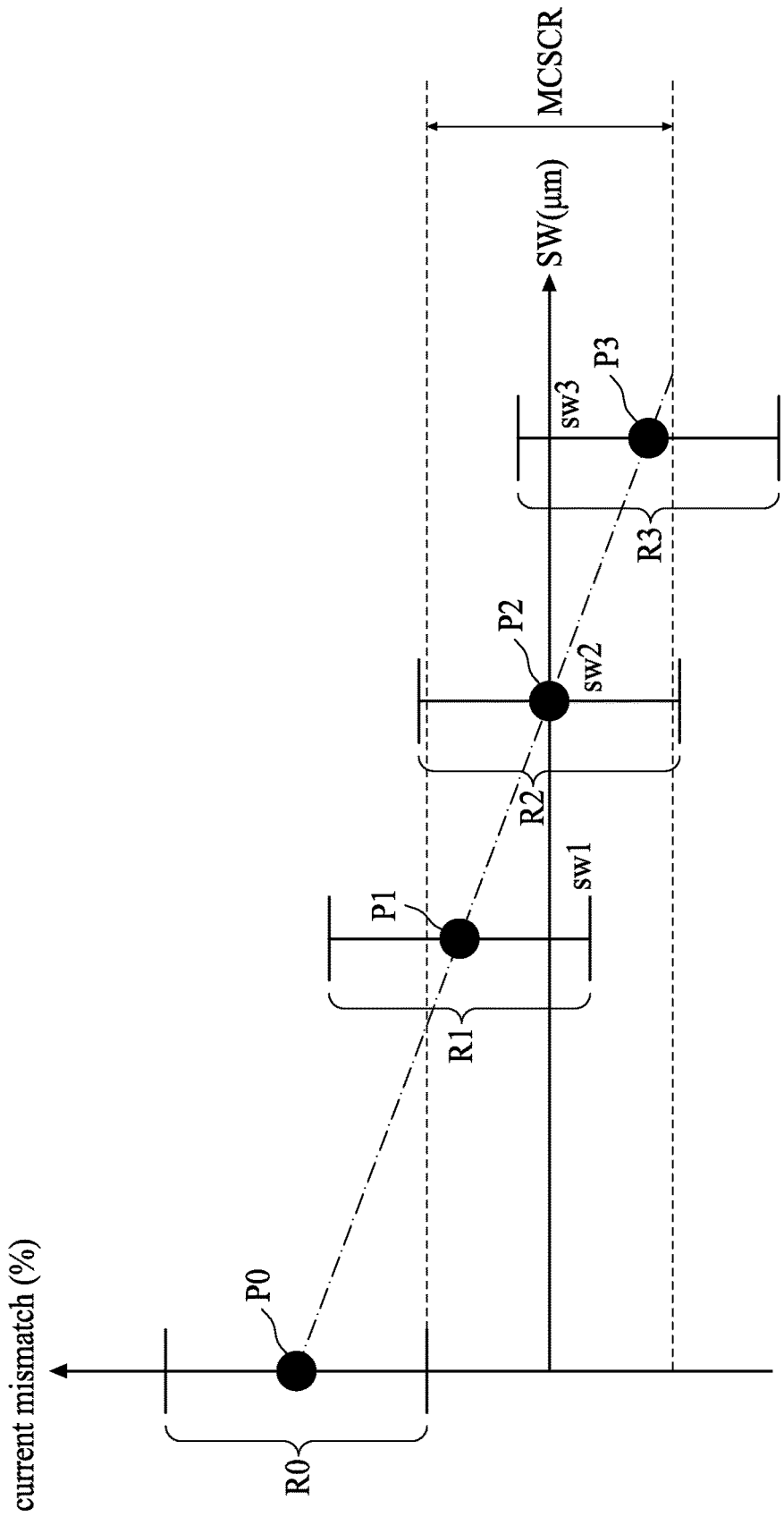

FIGS. 3A and 3B are diagrams illustrating current mismatch at different second widths SW, in accordance with some embodiments. Referring to FIG. 3A, the substrate 12 may include one of a first second region 161, a second second region 162 and a third second region 163. For convenience, the first second region 161, the second second region 162 and the third second region 163 are simultaneously shown. The first second region 161 has a first second width SW1. The second second region 162 has a second second width SW2. The third second region 163 has a third second width SW3. The first second width SW1 is smaller than the second second width SW2, which in turn is smaller than the third second SW3.

Referring to FIG. 3B, the y axis represents the degree (%) of current mismatch, and the x axis represents the second width SW in micrometers (um). Point P0 represents an ETC current mean-shift degree in a situation where the substrate 12 is free of any second region, and therefore the width of the second region is equal to zero. A dynamic range R0 represents one standard deviation from the ETC current mean-shift at point P0.

Moreover, point P1 represents an ETC current mean-shift degree in a situation where the substrate 12 includes the first second region 161 having the first second width SW1. A first dynamic range R1 represents one standard deviation from the ETC current mean shift at point P1.

Likewise, point P2 represents an ETC current mean-shift degree in a situation where the substrate 12 includes the second second region 162 having the second second width SW2. A second dynamic range R2 represents one standard deviation from the ETC current mean shift at point P2. In the present embodiment, point P2 sits on the x-axis, which means that the ETC current mean-shift degree is equal to zero.

Furthermore, point P3 represents an ETC current mean-shift degree in a situation where the substrate 12 includes the third second region 163 having the third second width SW3. A third dynamic range R3 represents one standard deviation from the ETC current mean shift at point P3.

The ETC current mean-shift degree at point P0 is larger than the ETC current mean-shift degree at point P1, which in turn is larger than the ETC current mean-shift degree at point P2, which in turn is larger than the ETC current mean-shift degree at point P3. Accordingly, the ETC mean-shift degree decreases as the second width SW increases. Moreover, the ETC current mean shift, which is considered a main factor of current mismatch, can be reduced or eliminated by adjusting the width of the second width SW. In other words, current mismatch can be effectively alleviated by adjusting the second width SW.

While the ETC mean-shift degree decreases as the second width SW increases, the dynamic range is required to satisfy the Monte Carlo simulation covered range (MCSCR). MCSCR is a default parameter of simulation software, such as Spice. If a dynamic range does not fall within the Monte Carlo simulation covered range, the simulation cannot reflect the real degree of current mismatch. For example, assuming the maximum current mismatch degree of the Monte Carlo simulation covered range is 5%, and the real degree of current mismatch is 10%, then the simulation can only reflect 5% instead of the entire 10%. In the scenario associated with point P2, even though the ETC current mean-shift degree is greatly reduced, the range R2 may still exceed the MCSCR. To improve the dynamic range R2, it may be needed to adjust the first width $W_{hd}$, as will be described in detail with reference to FIGS. 4A and 4B below.

Figure 4A:
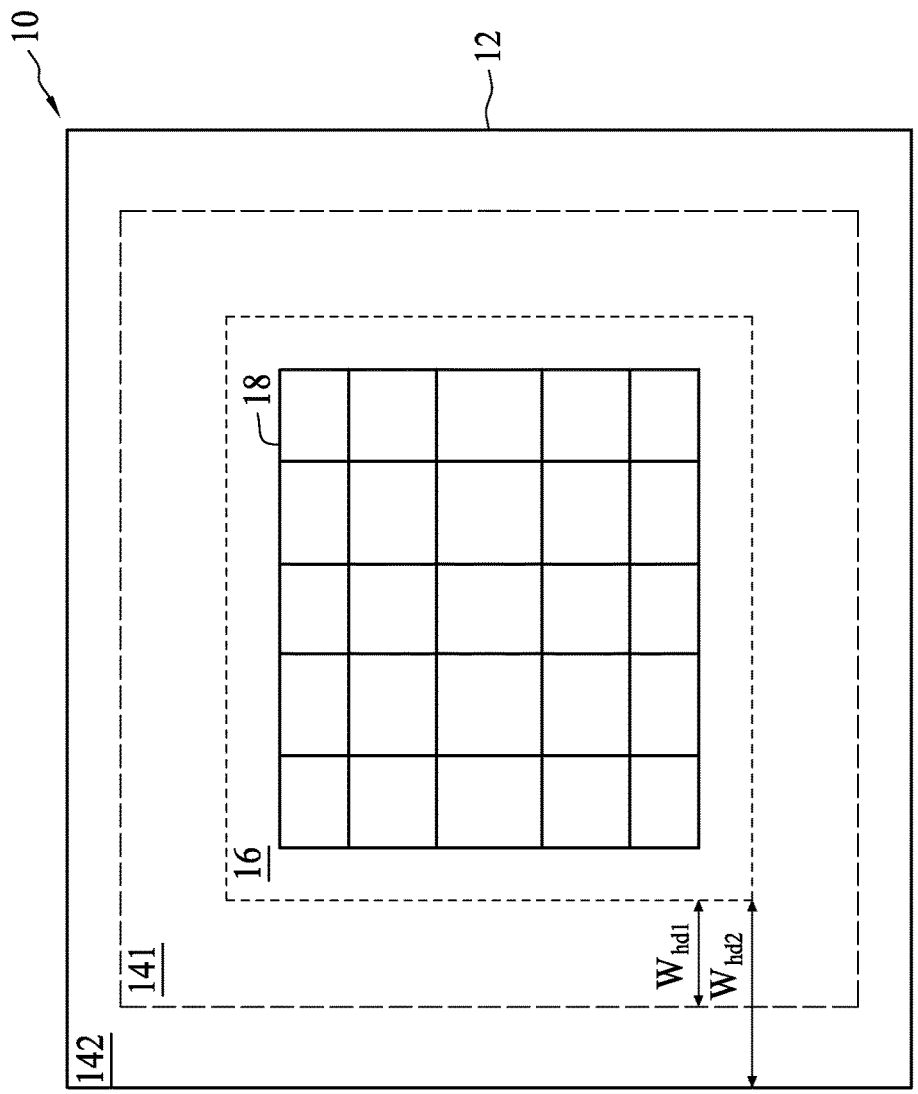
FIGS. 4A and 4B are diagrams illustrating current mismatch at different first widths, in accordance with some embodiments.
Figure 4B:
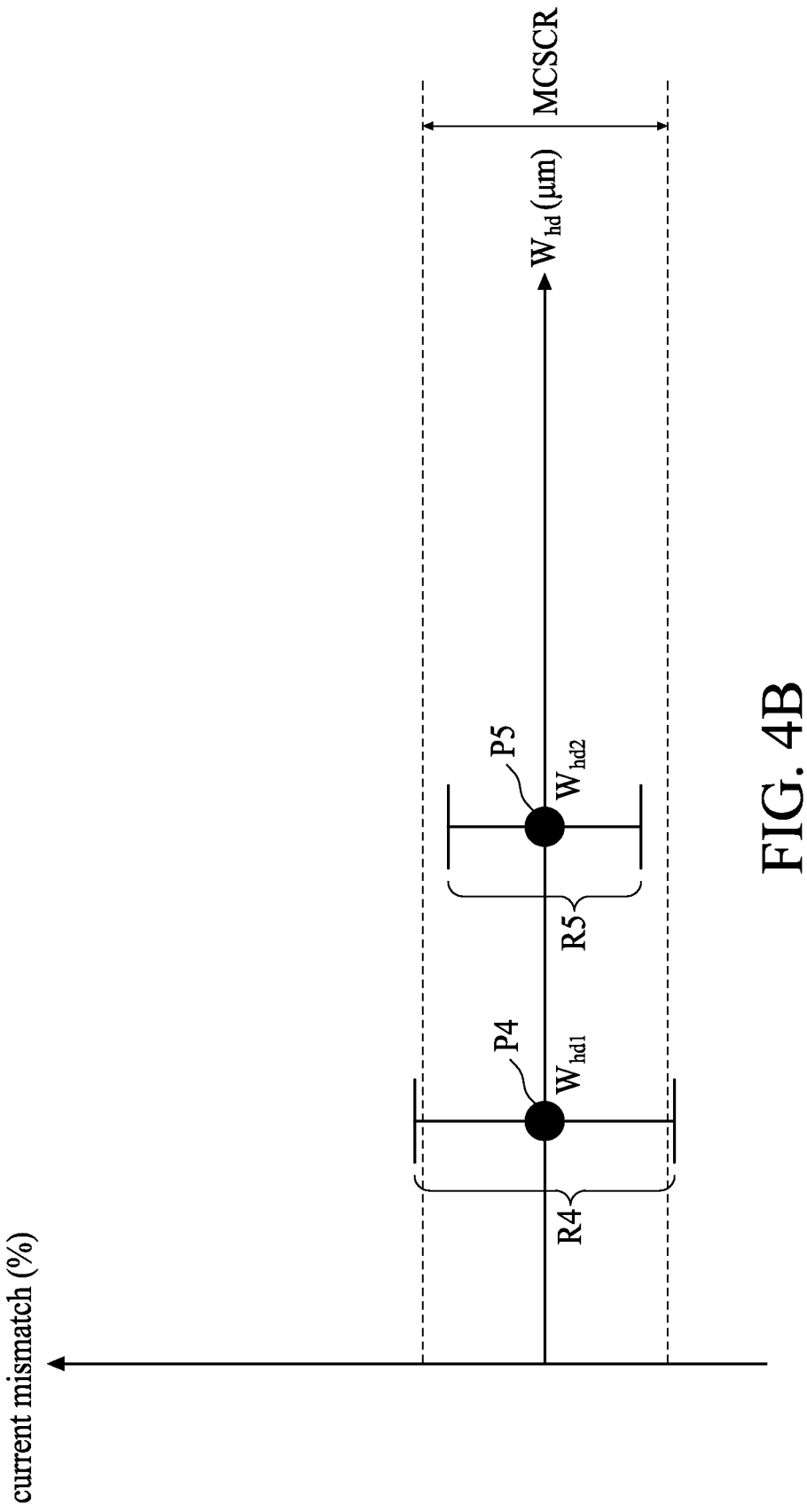

FIGS. 4A and 4B are diagrams illustrating current mismatch at different first widths $W_{hd}$, in accordance with some embodiments. Referring to FIG. 4A, the substrate 12 may include one of a first first region 141 and a second first region 142. For convenience, the first first region 141 and the second first region 142 are simultaneously shown. The first first region 141 has a first first width $W_{hd1}$. The second first region 142 has a second first width $W_{hd2}$. The first first width $W_{hd1}$ is smaller than the second first width $W_{hd2}$.

Referring to FIG. 4B, the y axis represents the degree (%) of current mismatch, and the x axis represents the first width SW in micrometers (μm). Point P4 represents an ETC current mean-shift degree in a situation where the substrate 12 includes the first first region 141 surrounding the second region 16. A fourth dynamic range R4 represents one standard deviation from the ETC current mean-shift at point P4. The fourth dynamic range R4 is obtained by adjusting the first width $W_{hd}$ to the first first width $W_{hd1}$.

Point P5 represents an ETC current mean-shift degree in a situation where the substrate 12 includes the second first region 142 surrounding the second region 16. A fifth dynamic range R5 represents one standard deviation from the ETC current mean-shift at point P5. The fifth dynamic range R5 is obtained by adjusting the first width $W_{hd}$ to the second first width $W_{hd2}$.

The ETC current mean-shift degrees at points P4 and P5 are kept unchanged. However, the fifth dynamic range R5 becomes smaller than the fourth dynamic range R4 as the first width $W_{hd}$ increases from $W_{hd1}$ to $W_{hd2}$. Further, the fifth dynamic range R5 falls within the Monte Carlo simulation covered range (MCSCR). As a result, the simulation is able to reflect the real degree of current mismatch.

It can be found from FIG. 4B that a dynamic range decreases as the first width $W_{hd}$ increases. The ETC current standard deviation, which is also a factor of current mismatch, can be reduced by adjusting the width of the first width $W_{hd}$ in order to alleviate the current mismatch issue.

Effectively, the cell array 18 is surrounded by the second second region 162 as shown in FIG. 3B, which is in turn surrounded by the second first region 142 as shown in FIG. 4B. As a result, both ETC current mean-shift and ETC current standard deviation can be improved, and therefore current mismatch can be alleviated.

To address the current mismatch issue, the additional area for the first region 14 and the second region 16 inevitably incurs area penalty. Referring back to FIG. 1, given the width of x and the length of y, the area of the cell array 18 is xy. The area of the substrate 12 can be calculated below:

$$(x+2sw+2W_{hd})(y+2sw+2W_{hd})$$

The total area of the first region 14 and the second region 16 is obtained by subtracting the area of the cell array 18 from the area of the substrate 10, as shown below:

$$(x+2sw+2W_{hd})(y+2sw+2W_{hd})-xy=2(SW+W_{hd})(x+y)+4(SW+W_{hd})^2$$

The area penalty, which is defined as the ratio of the additional area to the area of the cell array 18, is expressed as follows.

$$[2(SW+W_{hd})(x+y)+4(SW+W_{hd})^2]/xy$$

Assuming that the width of the cell array 18 is approximately 100 μm, the length of the cell array 18 is also approximately 100 μm, the second width SW is approximately 1 μm and the first width $W_{hd}$ is approximately 4 μm, the ratio of the area penalty is approximately 21%.

In certain existing semiconductor devices, a substrate includes a cell array surrounded by a dummy region whose pattern density is lower than that of the cell array. During a thermal process, heat would be introduced into an edge cell of the cell array via a part of the dummy region neighboring the edge cell. Consequently, current mismatch between the center cell of the cell array and another cell occurs. Moreover, a serious case of current mismatch may occur between an edge cell and the center cell.

In some existing approaches, in order to alleviate the current mismatch issue, a cell array is surrounded by an identical dummy region whose pattern density is equal to that of the cell array. The identical dummy region may, for example, include transistors identical to those in the cell array. In general, regions having the same pattern density have the same ability to reflect heat. As a result, edge cells of the cell array can now be protected by the identical dummy region surrounding the cell array from heat attack via a part of the identical dummy region neighboring the edge cells. In this way, the current mismatch between the center cell and the edge cell can be alleviated. However, in these approaches, area penalty is relatively high, as can be estimated below.

Having the same pattern density as the cell array, the identical dummy region has a width of $W_{DGE}$ significantly greater than the first width $W_{hd}$ according to the present disclosure. By comparison, the first width $W_{hd}$ is approximately 20% to 30% of the width $W_{DGE}$. For example, the width $W_{DGE}$ is approximately 15 to 20 μm, while the first width $W_{hd}$ is only 4 μm.

The area of the substrate in the existing approaches can be expressed as:

$$(x+2W_{DGE})(y+2W_{DGE})$$

The area of the identical dummy region can be calculated below:

$$(x+2W_{DGE})(y+2W_{DGE})-xy=2W_{DGE}(x+y)+4W_{DGE}^2$$

Accordingly, the area penalty can be expressed below:

$$\frac{2W_{DGE}(x+y)+4W_{DGE}^2}{xy}$$

Assuming the width $W_{DGE}$ is 15 μm, the width of the cell array is 100 μm, and the length of the cell array is 100 μm, the area penalty is 69%, which is more than three times the area penalty (21%) of the semiconductor device 10 as shown in FIG. 1.

FIG. 5 is a schematic layout view of a semiconductor device 50, in accordance with some embodiments. The semiconductor device 50 includes a substrate 52 and the cell array 18 in the substrate 52. The substrate 50 is similar to the substrate 12 described and illustrated with reference to FIG. 1 except that, for example, the cell array 18 is surrounded by a second region 56 which includes layout patterns. As a result, the second region 56 has a non-zero second pattern density. Nevertheless, the second pattern density of the second region 56 is smaller than the third pattern density of the cell array 18, which in turn is smaller than the first density of the first region 14.

Figure 6A:
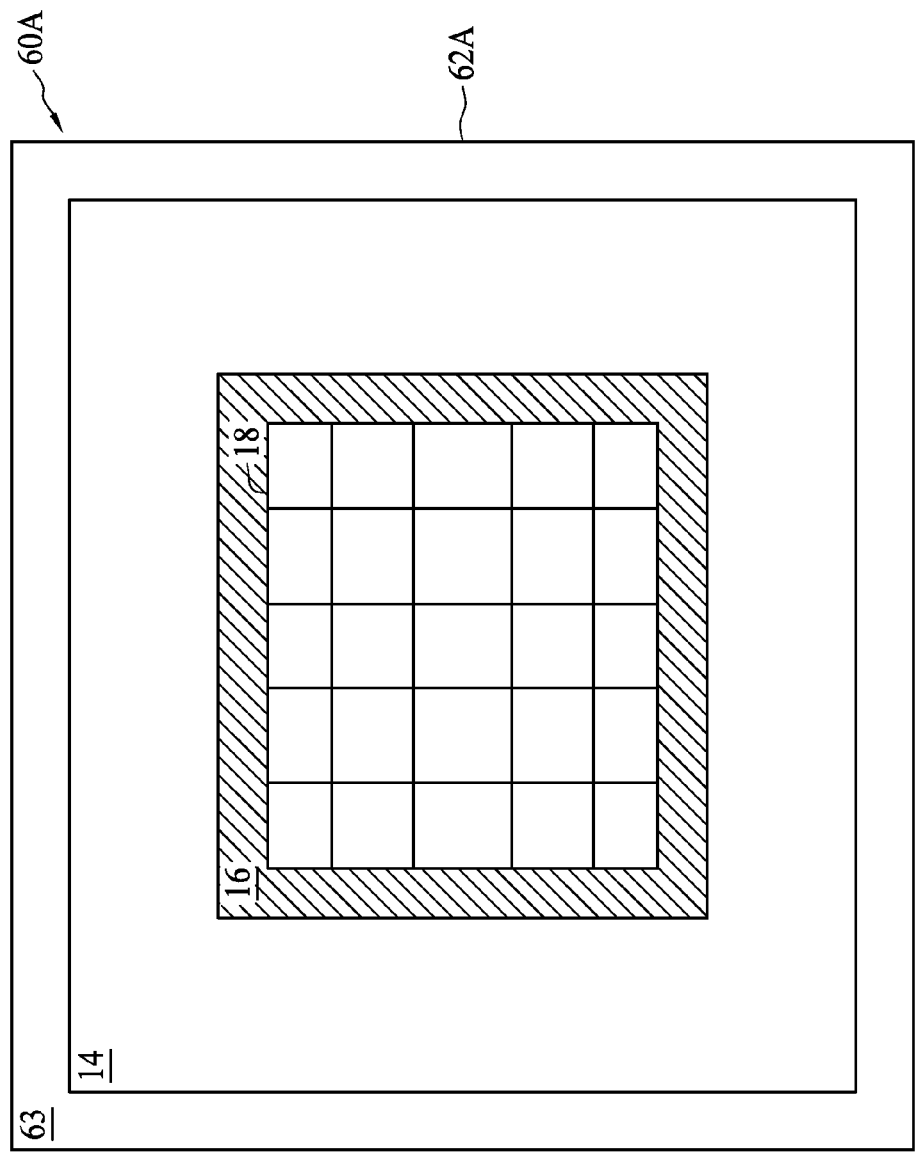
FIG. 6A is a schematic layout view of a semiconductor device, in accordance with some embodiments.

FIG. 6A is a schematic layout view of a semiconductor device 60A, in accordance with some embodiments. The semiconductor 60A includes a substrate 62A and the cell array 18 in the substrate 62A. The substrate 62A is similar to the substrate 12 described and illustrated with reference to FIG. 1 except that, for example, the substrate 62A further includes a pick-up region 63 surrounding the first region 14.

The pick-up region 63 is configured to provide a pick-up function and includes, for example, a plurality of patterns of transistors. The transistors are arranged to provide bias voltage to the body of the transistors in the cell array 18. Since a pick-up region is generally required in a layout design, the area of the pick-up region 63 is thus not counted when calculating the area penalty.

FIG. 6B is a schematic layout view of a semiconductor device 60B, in accordance with some embodiments. The semiconductor 60B includes a substrate 62B and the cell array 18 in the substrate 62B. The cell array 18 is surrounded by the second region 16, which is in turn surrounded by a first region 64. The first region 64 is similar to the first region 14 described and illustrated with reference to FIG. 1 except that, for example, the first region 64 also serves as a pick-up region for providing the pick-up function. As such, the area of the first region 64 cannot be counted in the area penalty. Accordingly, the area penalty can be reduced to one smaller than 3% because only the area of the second region 16 accounts for the area penalty.

Figure 7A:
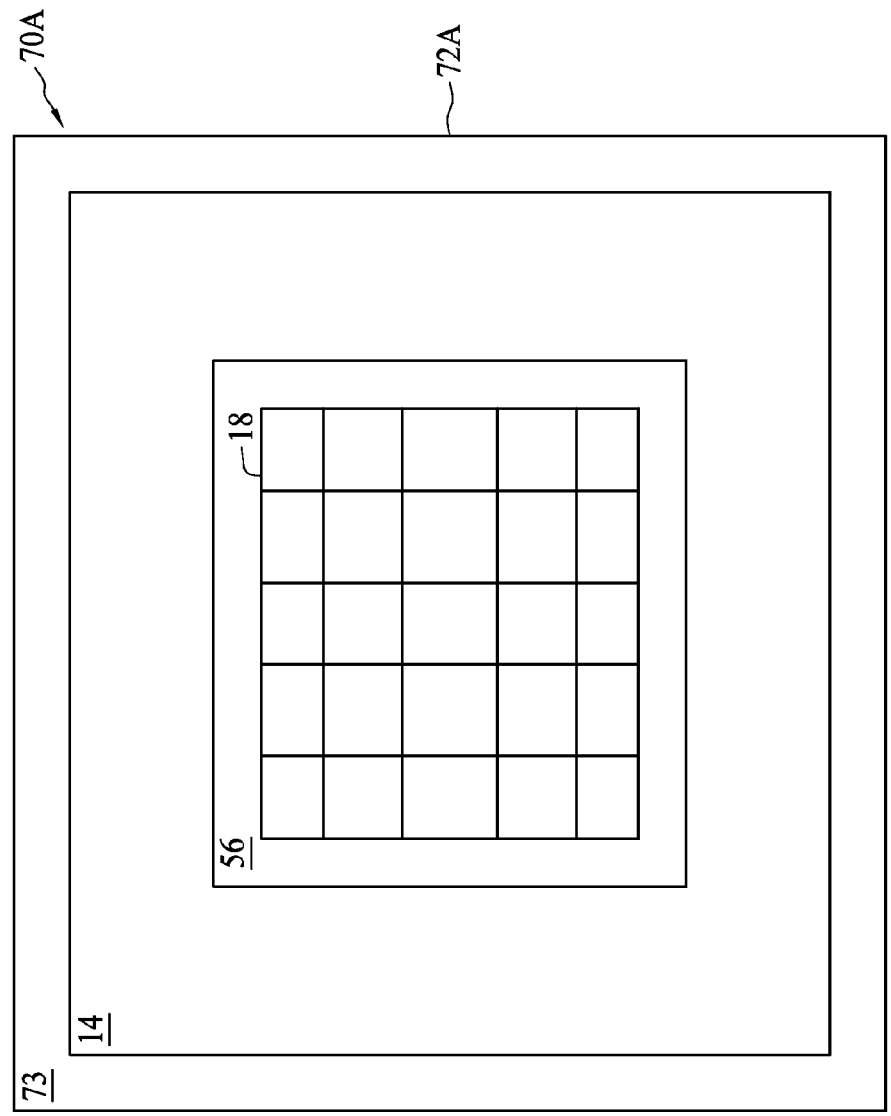
FIG. 7A is a schematic layout view of a semiconductor device, in accordance with some embodiments.

FIG. 7A is a schematic layout view of a semiconductor device 70A, in accordance with some embodiments. The semiconductor 70A includes a substrate 72A and the cell array 18 in the substrate 72A. The substrate 72A is similar to the substrate 52 described and illustrated with reference to FIG. 5 except that, for example, the substrate 72A further includes a pick-up region 73 surrounding the first region 14. The area of the pick-up region 73 cannot be counted in the area penalty.

FIG. 7B is a schematic layout view of a semiconductor device 70B, in accordance with some embodiments. The semiconductor 70B includes a substrate 72B and the cell array 18 in the substrate 72B. The cell array 18 is surrounded by the second region 16, which in turn is surrounded by a first region 74. The first region 74 is similar to the first region 14 described and illustrated with reference to FIG. 1 except that, for example, the first region 74 also serves as a pick-up region for providing the pick-up function. As previously discussed, the area of the first region 74 cannot be counted in the area penalty. Accordingly, the area penalty can be reduced to one smaller than 3%.

Figure 8:
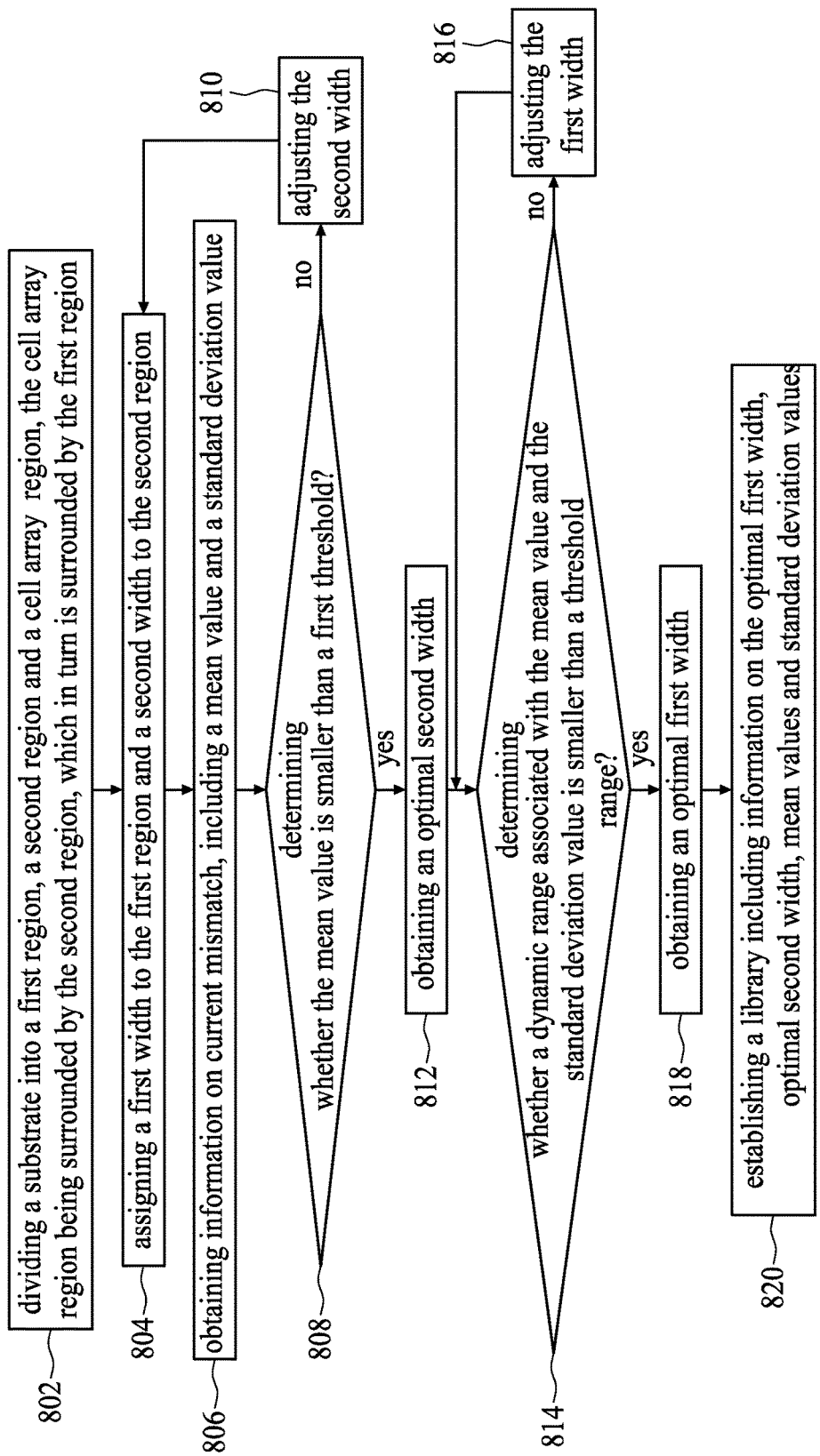
FIG. 8 is a flow diagram illustrating a method of designing a layout of a semiconductor device, in accordance with some embodiments.

FIG. 8 is a flow diagram illustrating a method of designing a layout of a semiconductor device, in accordance with some embodiments. Referring to FIG. 8, in operation 802, and also referring to FIG. 1, a substrate is divided into a first region, a second region and a cell array region. The cell region, in which an array of cells that include transistors is to be formed, is surrounded by the second region, which in turn is surrounded by the first region.

In operation 804, initially a first width is assigned to the first region and a second width is assigned to the second region. In an embodiment, the second width is approximately 10% to 20% of the first width. In another embodiment, the first width is approximately 4 µm and the second width is approximately 1 µm.

In operation 806, information on current mismatch associated with the first width and second width is obtained. The information includes a mean value and a standard deviation value of the current mismatch.

In operation 808, also referring to FIG. 3B, it is determined whether the mean value (the ETC current mean shift) is smaller than or equal to a first threshold. In an embodiment, the first threshold is approximately zero. If not, in operation 810, also referring to FIG. 3A, the second width is adjusted and operations 804 to 808 are repeated. If affirmative, in operation 812, an optimal second width for the second region is determined.

Subsequent to operation 812, in operation 814, also referring to FIG. 4B, it is determined whether a dynamic range associated with the mean value and standard deviation value is smaller than a threshold range. In some embodiments, the dynamic range refers to one that is one standard deviation from the mean value. Moreover, the threshold range is the Monte Carlo simulation covered range (MC-SCR).

If the dynamic range is not smaller than the threshold range (in the embodiment, does not fall within the MCSCR), in operation 816, also referring to FIG. 4A, the first width is adjusted and the operation 814 is repeated. If the dynamic range is smaller than the threshold range (in the embodiment, falls within the MCSCR), in operation 818, an optimal first width for the first region is determined.

It should be noted that the operations 814 and 808 are interchangeable. Accordingly, in operation 808 it is determined whether the dynamic range is smaller than the threshold range. If not, the first width is adjusted in operation 810 and operations 804 to 808 now associated with the first width are repeated until an optimal first width is determined in operation 812. Subsequently, in operation 814, it is determined whether the second width is smaller than the first threshold. If not, in operation 816, the second width is adjusted and operation 814 is repeated until an optimal second width is determined in operation 818.

In operation 820, a library including information on the optimal first width, the optimal second width, the mean values and standard deviation values is established. The information may be applied to manufacturing a semiconductor device during a manufacturing process, as will be discussed with reference to FIG. 9.

In some embodiments, the first region, the second region and the cell array region have a first pattern density, a second pattern density and a third pattern density, respectively. Moreover, the first pattern density is greater than the third pattern density, which in turn is greater than the second pattern density. Furthermore, the second pattern density can be zero. Given the same relationship among these pattern densities, different optimal first widths and optimal second widths at different first, second and third densities may be obtained and stored in the library, which facilitates the manufacturing of semiconductor devices of different sizes and function parameters.

Figure 9:
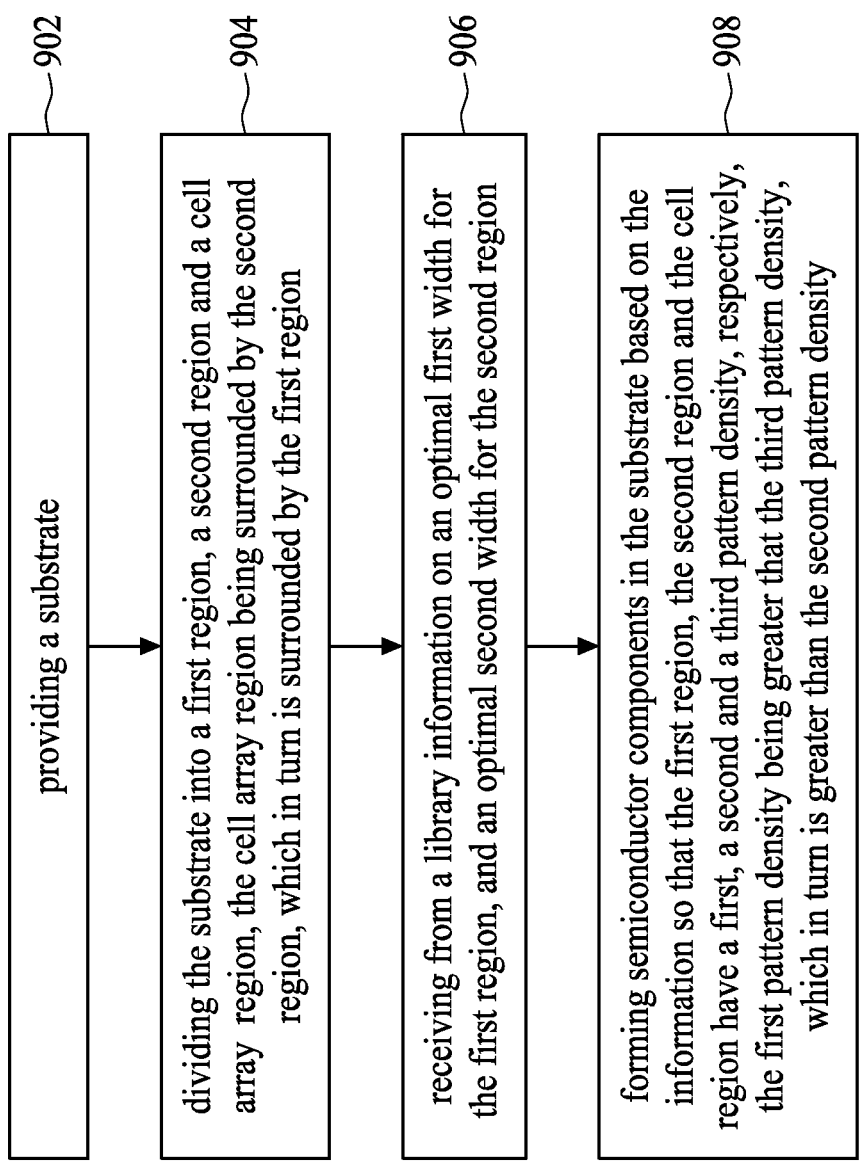
FIG. 9 is a flow diagram illustrating a method of manufacturing a semiconductor device, in accordance with some embodiments.

FIG. 9 is a flow diagram illustrating a method of manufacturing a semiconductor device, in accordance with some embodiments.

In operation 902, and also referring to FIG. 1, a substrate to be formed with semiconductor components is provided.

Next, in operation 904, the substrate is divided into a first region, a second region and a cell array region. The cell region, in which an array of cells that include transistors is to be formed, is surrounded by the second region, which in turn is surrounded by the first region.

In operation 906, information on an optimal first width for the first region and an optimal second width for the second region 14 is received from a library. The library has been established earlier in accordance with the embodiments described and illustrated with reference to FIG. 8.

Subsequently, in operation 908, semiconductor components are formed in the substrate based on the information from the library. Moreover, the first region, the second region and the cell array region have a first pattern density, a second pattern density and a third pattern density, respectively. Furthermore, the first pattern density is greater than the third pattern density, which in turn is greater than the second pattern density.

In an embodiment, in forming semiconductor components in the substrate in operation 908, semiconductor components serving pick-up function are formed in the first region. In another embodiment, in forming semiconductor components in the substrate in operation 908, no semiconductor components are formed in the second region.

Some embodiments have one or a combination of the following features and/or advantages. In some embodiments, a semiconductor device includes a cell array, a first region and a second region. The first region surrounds the cell array and has a first pattern density. The second region is between the cell array and the first region. The second region surrounds the cell array and has a second pattern density smaller than a third pattern density of the cell array, which in turn is smaller than the first pattern density.

In some embodiments, in a method of designing a layout of a semiconductor device, a substrate is divided into a first region, a second region and a cell array region. The cell array region is surrounded by the second region, which in turn is surrounded by the first region. A first width is assigned to the first region and a second width is assigned to the second region. Information on current mismatch associated with the first width and the second width, including a mean value and a dynamic range is obtained. The second width is adjusted until the mean value associated with the adjusted second width is smaller than a first threshold. Or, the first width is adjusted until the dynamic range associated with the adjusted first width is smaller than a threshold range.

In some embodiments, in a method of manufacturing a semiconductor device, a substrate is provided. The substrate is divided into a first region, a second region and a cell array region. The cell array region is surrounded by the second region, which in turn is surrounded by the first region. Semiconductor components are formed in the first region, the second region and the cell array region so that the first region, the second region and the cell array region have a first pattern density, a second pattern density and a third pattern density, respectively. The first pattern density is greater than the third pattern density, which in turn is greater than the second density.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a cell array;
    a first region surrounding the cell array and having a first pattern density; and
    a second region between the cell array and the first region, the second region surrounding the cell array and having a second pattern density smaller than a third pattern density of the cell array, which in turn is smaller than the first pattern density.

2. The semiconductor device as claimed in claim 1, wherein the first region has a first width, and the second region has a second width smaller the first width.

3. The semiconductor device as claimed in claim 1, wherein the second width ranges from 10% to 20% of the first width.

4. The semiconductor device as claimed in claim 1, wherein the first width ranges from 4 micrometer (um) to 6 um.

5. The semiconductor device as claimed in claim 1, wherein the second width is 1 um.

6. The semiconductor device as claimed in claim 1 further comprising a pick-up region surrounding the first region.

7. The semiconductor device as claimed in claim 1, wherein the first region includes a pick-up region.

8. The semiconductor device as claimed in claim 1, wherein the second pattern density is zero.

9. A method of designing a layout of a semiconductor device, the method comprising:
    dividing a substrate into a first region, a second region and a cell array region, wherein the cell array region being surrounded by the second region, which in turn is surrounded by the first region;
    assigning a first width to the first region and a second width to the second region;
    obtaining information on current mismatch associated with the first width and the second width, including a mean value and a dynamic range; and
    adjusting the second width until the mean value associated with the adjusted second width is smaller than a first threshold, or adjusting the first width until the dynamic range associated with the adjusted first width is smaller than a threshold range.

10. The method as claimed in claim 9, wherein the first threshold includes a zero mean value, and the threshold range includes a Monte Carlo simulation covered range (MCSCR).

11. The method as claimed in claim 9 further comprising:
    establishing a library including information on an optimal first width for the first region and an optimal second width for the second region.

12. The method as claimed in claim 11, wherein the optimal second width ranges from 10% to 20% of the optimal first width.

13. The method as claimed in claim 9, wherein the first region, the second region and the cell array region have a first pattern density, a second pattern density and a third pattern density, respectively, the first pattern density being greater than the third pattern density, which in turn is greater than the second pattern density.

14. The method as claimed in claim 9, wherein the first region includes a pick-up region.

15. A method of manufacturing a semiconductor device, the method comprising:
    providing a substrate;
    dividing the substrate into a first region, a second region and a cell array region, wherein the cell array region being surrounded by the second region, which in turn is surrounded by the first region; and
    forming semiconductor components in the first region, the second region and the cell array region so that the first region, the second region and the cell array region have a first pattern density, a second pattern density and a third pattern density, respectively, wherein the first pattern density is greater than the third pattern density, which in turn is greater than the second density.

16. The method as claimed in claim 15, wherein the first region has a first width, and the second region has a second width smaller than the first width.

17. The method as claimed in claim 16, wherein the second width ranges from 10% to 20% of the first width.

18. The method as claimed in claim 15 further comprising forming a pick-up region surrounding the first region.

19. The method as claimed in claim 15 further comprising forming semiconductor components serving pick-up function in the first region.

20. The method as claimed in claim 15 further comprising forming no semiconductor components in the second region.

* * * * *